(12) United States Patent
Torresin et al.

(10) Patent No.: US 12,068,174 B2
(45) Date of Patent: Aug. 20, 2024

(54) ARRANGEMENT OF A POWER SEMICONDUCTOR MODULE AND A COOLER

(71) Applicant: Hitachi Energy Ltd, Zurich (CH)

(72) Inventors: Daniele Torresin, Baden (CH); Fabian Mohn, Ennetbaden (CH); Bruno Agostini, Zurich (CH); Thomas Gradinger, Aarau Rohr (CH); Juergen Schuderer, Zurich (CH)

(73) Assignee: Hitachi Energy Ltd, Zurich (CH)

( * ) Notice: Subject to any disclaimer, the term of this patent is extended or adjusted under 35 U.S.C. 154(b) by 341 days.

(21) Appl. No.: 17/630,080

(22) PCT Filed: Jul. 24, 2020

(86) PCT No.: PCT/EP2020/071001
§ 371 (c)(1),
(2) Date: Jan. 25, 2022

(87) PCT Pub. No.: WO2021/014002
PCT Pub. Date: Jan. 28, 2021

(65) Prior Publication Data
US 2022/0254653 A1 Aug. 11, 2022

(30) Foreign Application Priority Data
Jul. 25, 2019 (EP) .................................. 19188381

(51) Int. Cl.
*H01L 21/48* (2006.01)
*H01L 23/367* (2006.01)
(Continued)

(52) U.S. Cl.
CPC ...... *H01L 21/4882* (2013.01); *H01L 21/4842* (2013.01); *H01L 23/3672* (2013.01);
(Continued)

(58) Field of Classification Search
CPC ............. H01L 21/4882; H01L 21/4842; H01L 23/3672; H01L 23/3677; H01L 23/473;
(Continued)

(56) References Cited

U.S. PATENT DOCUMENTS

| 9,578,789 B2 | 2/2017 | Uhlemann et al. |
| 2009/0249624 A1 | 10/2009 | Guo et al. |

(Continued)

FOREIGN PATENT DOCUMENTS

| CN | 203722992 U | 7/2014 |
| CN | 207165550 U | 3/2018 |
| EP | 3276657 A1 | 1/2018 |
| JP | 5382049 B2 | 1/2014 |
| WO | 2014045766 A1 | 3/2014 |
| WO | 2015176194 A1 | 11/2015 |
| WO | 2017069005 A1 | 4/2017 |

*Primary Examiner* — Patricia D Valenzuela
(74) *Attorney, Agent, or Firm* — Slater Matsil, LLP

(57) ABSTRACT

In one embodiment a power semiconductor module includes a substrate having a first substrate side for carrying an electric circuit and having a second substrate side being located opposite to the first substrate side. The second substrate side has a flat surface and is adapted for coming in contact with a cooler. A cooling area that is surrounded by a connecting area is located at the second substrate side. A first casing component of the cooler is connected to the second substrate side at the connecting area and a second casing component is connected to the first casing component such that a cooling channel for providing the cooling area with cooling fluid is provided between the first casing component and the second casing component. A cooling structure can be welded to the cooling area at the second substrate side.

23 Claims, 4 Drawing Sheets

(51) Int. Cl.
*H01L 23/473* (2006.01)
*H05K 7/20* (2006.01)

(52) U.S. Cl.
CPC ........ *H01L 23/3677* (2013.01); *H01L 23/473* (2013.01); *H01L 2924/0002* (2013.01); *H05K 7/20927* (2013.01)

(58) Field of Classification Search
CPC ......... H01L 21/565; H01L 2224/48472; H01L 2924/181; H01L 23/4334; H01L 23/3735; H01L 25/072; H01L 25/18; H01L 23/10; H01L 2924/19107; H01L 23/40; H01L 2924/0002; H05K 7/20927
See application file for complete search history.

(56) References Cited

U.S. PATENT DOCUMENTS

| | | | |
|---|---|---|---|
| 2013/0285234 A1* | 10/2013 | Uhlemann | H01L 23/473 257/782 |
| 2014/0327127 A1 | 11/2014 | Hable et al. | |
| 2014/0347818 A1* | 11/2014 | Uhlemann | H05K 7/20927 361/699 |
| 2014/0361425 A1 | 12/2014 | Mamitsu et al. | |
| 2015/0008574 A1 | 1/2015 | Gohara et al. | |
| 2017/0304922 A1 | 10/2017 | Uhlemann et al. | |

* cited by examiner

ARRANGEMENT OF A POWER SEMICONDUCTOR MODULE AND A COOLER

CROSS-REFERENCE TO RELATED APPLICATIONS

This application is a national stage application of International Application No. PCT/EP2020/071001, filed on Jul. 24, 2020, which claims priority to European Patent Application No. 19188381.8, filed on Jul. 25, 2019, which applications are hereby incorporated herein by reference.

TECHNICAL FIELD

The present invention relates to an arrangement of a power semiconductor module and a cooler.

BACKGROUND

Power semiconductor modules are well known in the art in different applications. As an example, it is known to position electric circuits soldered on substrates in a housing and encapsulate the electric circuits in a resin which is filled in the housing.

However, transfer-molded and particularly sintered power modules have become an interesting alternative to the traditional approach because of the increased cycle reliability of the power module. Nevertheless, this adds more complexity for the integration of the electric circuit such as comprising three phases on a common baseplate or cooler. Whereas substrates can be fully assembled with wire bonds when heading for subsequent substrate soldering, substrates for sintering cannot or only hardly be wire bonded and tested prior to sintering, since the sintering approach requires a strong pressure on the substrates. The pressure is typically applied mechanically with a rubber stamp, which would destroy the wire bonding.

For this reason, the one-step sintering of a six-pack module, for example, is economically very risky. It may be preferred to head for a six-pack configuration made by three different transfer-molded and sintered half bridge modules.

However, there are different issues to be regarded when using transfer-molded modules.

For example, the integration by using O-ring has room for improvements for reliability reasons, such as due to aging of the O-ring. The usage of screws requires storage and part numbers for the assembly line. Furthermore, this solution requires space for the O-ring cavity and screws due to the amount of screws, such as four screws for a half-bridge module.

It is important that the method or technology used for the integration of the electric circuits must not damage the power modules. In particular, it may be preferred that the temperature does not exceed 225° C. in order not to damage the mold compound. Further, mechanical stresses should be avoided.

It should further be avoided that integration by welding technologies generates small cracks and pores that cause leakage.

Apart from that, a fluid enclosure of a fluid-based cooler should be robust and leak tight, and at the same time the design should be space saving and cheap.

EP 3 276 657 A1 describes a power semiconductor module arrangement having a cooler, wherein the cooler has a cooler body, a cavity formed in the cooler body, and a bonding wire. The bonding wire is disposed inside the cavity and directly bonded to a first surface of the cooler body. The bonding wire includes at least 95 percent by weight aluminum; at least 0.25 percent by weight silicon; and at least one of: at least 0.05 percent by weight magnesium and at least 0.05 percent by weight manganese.

US 2014/0327127 A1 describes a power module which comprises a semiconductor chip, a bonding substrate comprising an electrically conductive sheet and an electric insulator sheet which is directly attached to the electrically conductive sheet and which is thermally coupled to the semiconductor chip, and an array of cooling structures directly attached to the electrically conductive sheet and configured for removing heat from the semiconductor chip when interacting with cooling fluid.

US 2013/0285234 A1 describes a power module including a substrate having an electrically insulative member with opposing first and second metallized sides and one or more semiconductor die attached to the first metallized side of the substrate. A plurality of thermally conductive structures are laterally spaced apart from one another and individually attached directly to the second metallized side of the substrate so that the plurality of thermally conductive structures extend outward from the second metallized side.

US 2017/0304922 A1 describes a semiconductor module including a substrate having a metallized first side and a metallized second side opposing the metallized first side. A semiconductor die is attached to the metallized first side of the substrate. A plurality of cooling structures are welded to the metallized second side of the substrate. Each of the cooling structures includes a plurality of distinct weld beads disposed in a stacked arrangement extending away from the substrate. The substrate can be electrically conductive or insulating. Corresponding methods of manufacturing such semiconductor modules and substrates with such welded cooling structures are also provided.

CN207165550 U provides a module with liquid cooling.

CN203722992 U discloses an embedded multi-channel heat radiation module component.

U.S. Pat. No. 9,578,789 B2 describes a power semiconductor module including a substrate and a two-part cooling system arranged under the substrate. The cooling system has upper and lower pieces. The upper piece forms a flow channel with the substrate for a cooling liquid. The upper piece has a first inflow and an outflow, through which the cooling liquid can be introduced into the flow channel and removed. The upper piece also has at least one second inflow, which is spaced apart from the first inflow in a longitudinal direction. The lower piece has an inlet and an outlet, the outlet being connected to the outflow and the inlet being connected to the first inflow. The lower piece also has a channel branching off from the inlet, which includes at least one bypass channel, which is connected to the second inflow, so part of the cooling liquid passes through the bypass channel into the flow channel.

WO 2015/176914 A1 discloses a welding process method for a radiator, in which a heating member, an aluminum-based PCB board and a radiator are provided in sequence from top to bottom, wherein the heating member and the aluminum-based PCB board are welded as a whole via a tin solder medium, and the whole is fixed with the radiator by means of welding. The heat dissipation effect is strengthened by means of welding, which changes the method for combining the combination of the heating member and the aluminum-based board with the radiator.

US 2009/249624 A1 describes a method of making a heat sink including the following steps: providing a base and a plurality of individual fins, and welding the fins successively to the base by ultrasonic welding method.

However, providing a power semiconductor module, such as a three-phase transfer-molded module with a cooler is still an issue. The prior art thus gives room for improvements with this regard.

SUMMARY

The present invention relates to an arrangement of a power semiconductor module and a cooler. Particular embodiments relate to a power semiconductor module having an improved connection to a cooler and an improved arrangement of the cooler. The present invention further relates to a method of forming a cooler.

Embodiments of the present invention provide a solution for overcoming at least one disadvantage of the prior art at least in part. For example, embodiments provide a solution for reliably connecting a power semiconductor module to an effective cooler in a simple and reliable manner.

Advantageous embodiments are given in the claims, in the description as well as in the figures, wherein the described embodiments can, alone or in any combination of the respective embodiments, provide a feature of the present invention unless clearly excluded.

BRIEF DESCRIPTION OF THE DRAWINGS

These and other aspects of the invention will be apparent from and elucidated with reference to the embodiments described hereinafter. Individual features disclosed in the embodiments con constitute alone or in combination an aspect of the present invention. Features of the different embodiments can be carried over from one embodiment to another embodiment.

In the drawings.

DETAILED DESCRIPTION OF ILLUSTRATIVE EMBODIMENTS

Figure 1:
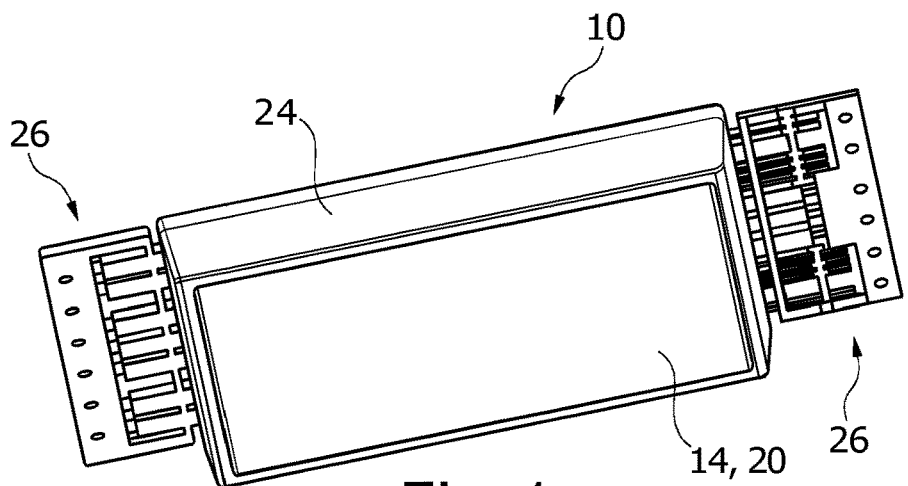
FIG. 1 shows an embodiment of a power semiconductor module.

Embodiments of the invention will first be described in text. Examples will then be described with respect to the drawings.

A method of providing a power semiconductor module with a cooler comprises providing the power semiconductor module, which comprises a substrate having a first substrate side for carrying at least one electric circuit and having a second substrate side being located opposite to the first substrate side. The power semiconductor module contains one out of the features a1) and a2). According to feature a1), the second substrate side has a flat surface and is adapted for coming in contact with the cooler, wherein located at the second substrate side is a cooling area which is surrounded by a connecting area.

According to feature a2), the power semiconductor module comprises a baseplate, wherein the baseplate comprises a first baseplate side and a second baseplate side being located opposite to the first baseplate side, wherein the second substrate side is connected to the first baseplate side, wherein the second baseplate side has a flat surface and is adapted for coming in contact with the cooler, wherein located at the second baseplate side is a cooling area which is surrounded by a connecting area.

If feature a1) is realized, the method comprises the steps of: b1) connecting a first casing component of the cooler to the second substrate side at the connecting area, wherein the first casing component optionally comprises at least one opening for receiving the cooling area; c1) connecting a second casing component to the first casing component such that a cooling channel for providing the cooling area with cooling fluid is provided between the first casing component and the second casing component; and d1) welding a cooling structure to the cooling area at the second substrate side.

If feature a2) is realized, the method comprises the steps of b2) connecting a first casing component of the cooler to the second baseplate side at the connecting area, wherein the first casing component optionally comprises at least one opening for receiving the cooling area; c2) connecting a second casing component to the first casing component such, that a cooling channel for providing the cooling area with cooling fluid is provided between the first casing component and the second casing component; and d2) welding a cooling structure to the cooling area at the second baseplate side.

Such a method may provide significant advantages over the cited prior art, in particular with regard to providing a cooler to the power semiconductor module. In particular, the method as described may serve for forming an inverter.

Further, it has to be noted that the steps as described above are not necessarily performed strictly in the order as described above. In particular, it may be preferred that step d1) is performed before or parallel to step c1) and that step d2) is performed before or parallel to step c1).

According to first method step a), a power semiconductor module is provided which comprises a substrate and optionally a baseplate. The substrate may particularly be a ceramic substrate which carries power semiconductor devices on a substrate metallization. The power semiconductor devices may thus be fixed to a substrate metallization, for example, and may form, together with other components, such as terminals and respective interconnections, an electric circuit.

Depending on the fact if the power semiconductor module has a baseplate or not, the power semiconductor contains one out of features a1) and a2) wherein the features a1) and a2) are explained in detail below.

According to feature a1), the second substrate side has a flat surface. This particularly means that the second substrate side, such as the bottom metallization, has a surface which is not provided with a specific cooling structure but which for example is formed by means of the ceramic main body of the substrate and the respective metallization. Thus, the second substrate side and thus the respective surface may proceed parallel to the plane of the substrate, or its main body, respectively.

The second substrate side is adapted for coming in contact with the cooler. With this regard, it is provided that the second substrate side is equipped with a cooling area, which is surrounded by a connecting area. The cooling area thus is the effective part with regard to cooling and is thus that part, which should be cooled by the cooler and should in particular come into contact with a cooling fluid which is guided through the cooler. The connecting area, however, is provided for connecting the substrate to the cooler and thus it is not required and not desired that this area comes into contact with a cooling fluid, for example, at least completely.

According to feature a2) and thus in case a baseplate is present, the baseplate is connected to the substrate in order to provide an especially efficient cooling effect of the power semiconductor devices.

Thus, whereas the first baseplate side is connected to the substrate and in detail to the second substrate side, the second baseplate side is adapted for being connected to the cooler. With this regard, it is provided that the second baseplate side is equipped with a cooling area which is surrounded by a connecting area. The cooling area thus is the effective part of the baseplate and is thus that part, which should be cooled by the cooler and should in particular come into contact with a cooling fluid which is guided through the cooler. The connecting area, however, is provided for connecting the baseplate to the cooler and thus it is not required and not desired that this area comes into contact with a cooling fluid, for example, at least completely.

It is further provided that the second baseplate side has a flat surface. This particularly means that the second baseplate side has a surface which is not provided with a specific cooling structure but which for example is formed by the surface of the main body of the baseplate as such. Thus, the second baseplate side and thus the respective surface may proceed parallel to the plane of the main body of the baseplate and additionally for example parallel to the substrate, for example.

In order to provide the power semiconductor module with the cooler, there are different options which may arise, in particular depending on the fact if feature a1) is realized or if feature a2) is realized. However, generally, the method of providing the cooler is performed correspondingly for the two named options, i.e., with or without baseplate.

In more detail, if feature a1) is realized, the method comprises the following steps.

According to method step b1), a first casing component of the cooler is connected and thus fixed to the second substrate side at the connecting area. This is preferably done by welding as described down below. The first casing component may for example be formed from a flat plate, or from a plate having an elevation which allows an easy handling. Further, in order to reliably fix the second substrate side with the first casing component such as by welding, it may be preferred that at least the connecting area of the second substrate side may be realized at a substrate metallization.

The first casing component may comprise at least one opening for receiving the cooling area. In other words, in case the first casing component is attached to the substrate, the cooling area may still be exposed so that it can be cooled by a cooling fluid which flows through the cooler. Thus, the cooling area is received by the opening. However, the provision of an opening may particularly depend on the fact if the cooling structure is provided independently from the casing and in particular from the first casing component or if it is connected thereto like described in more detail below. Further, as the first casing component is fixed to the connecting area, the cooling area is surrounded by the first casing component and particularly by the edge of the opening.

Further, according to method step c1), it is provided that the second casing component is connected to and thus fixed to the first casing component wherein it is provided that a cooling channel for providing the cooling area with cooling fluid is formed between the first casing component and the second casing component. The cooling channel may be a free volume which is present between the first casing component and the second cooling component or it may have a structure which guides the cooling fluid through defined paths.

According to method step d1), it is further provided that a cooling structure is welded to the cooling area at the second substrate side. The cooling structure is not specifically limited and may comprise inter alia turbulators, cooling pins and the like. For example, in case the cooling structures are formed from turbulators, they may be formed in a wavy form with round edges or with angled edges. The wave crests and/or the wave troughs may be flat, rounded or angled. The dimensions may be chosen according to the desired requirements. For example, the distance of the wave crests may lie in a range of between 2.5 mm to 5 mm and the height from the wave troughs to the wave crests may lie in the range of 2 mm to 12 mm, wherein these values, however, are in no way limiting. Apart from that, it may be provided that the cooling structures are formed from aluminum.

According to this embodiment, the cooling efficiency of the cooler may further be improved compared to a flat cooling area. This may be mainly due to the fact that the surface of the baseplate which can be cooled by the influence of a cooling fluid may be significantly increased.

The cooling structure may as further example be formed by using cooling pins.

It may be provided that the first casing component has an opening which is adapted for receiving the cooling structure. Further, the distance between the first casing component and the second casing component should be chosen such, there is sufficient space for placing the cooling structure. If the distance is greater than the length of cooling structure, then there could be fluid bypass in the gap between the tip of cooling structure and second casing component which would lead to a decrease of the thermal performance.

As an alternative to the above, however, if a baseplate is present and thus in case feature a2) is realized, the method comprises the following steps, which are essentially corresponding to above-described steps b1) to d1).

According to method step b2), a first casing component of the cooler is connected and thus fixed to the second baseplate side at the connecting area. This is preferably done by welding as described down below. The first casing component may for example be formed from a flat plate or from a plate which comprises an elevation, which allows an easy handling. Further, in order to reliably fix the second baseplate side with the first casing component such as by welding, it may be preferred that at least the connecting area of the second baseplate side may be from a metal or a metal alloy.

The first casing component may comprise at least one opening for receiving the cooling area. In other words, in case the first casing component is attached to the baseplate, the cooling area may still be exposed so that it can be cooled by a cooling fluid which flows though the cooler. Again, the provision of an opening may particularly depend on the fact if the cooling structure is provided independently from the casing and in particular from the first casing component or if it is connected thereto like described in more detail below.

Further, according to method step c2), it is provided that the second casing component is connected to and thus fixed to the first casing component wherein it is provided that a cooling channel for providing the cooling area with cooling fluid is provided between the first casing component and the second casing component. The cooling channel may be a free volume which is present between the first casing component and the second cooling component or it may have a structure which guides the cooling fluid through defined paths.

According to method step d2), it is further provided that a cooling structure is welded to the cooling area at the second baseplate side. The cooling structure is not specifically limited and may comprise inter alia turbulators, cooling pins and the like. According to this embodiment, the cooling efficiency of the cooler may further be improved. This may be mainly due to the fact that the surface of the baseplate which can be cooled by the influence of a cooling fluid may be significantly increased.

The cooling structure may for example be formed by using cooling pins or by further structures as described above with respect to feature d1).

Again, it may be provided that the first casing component has an opening which is adapted for receiving the cooling structure. Further, the distance between the first casing component and the second casing component may be chosen such, there is sufficient space for placing the cooling structure. If the distance is greater than the length of cooling structure, then there could be fluid bypass in the gap between the tip of cooling structure and second casing component which would lead to a decrease of the thermal performance.

The method as described above, thus allows in a very effective manner to provide a cooler at the power semiconductor module showing a reliable and efficient cooling behavior for the substrate optionally by means of a baseplate and thus the power semiconductor module. This is due to the fact that by providing a cooler which is based on a cooling fluid to be used has an efficient cooling behavior so that the power semiconductor module is cooled in a very effective manner.

Apart from that, due to the welding step, a reliable connection of the cooling structure to the substrate or the baseplate may be realized which ensures a long-term reliable arrangement.

With regard to the casing and thus the first casing component as well as the second casing component, which form the cooler, it may be provided that the casing components are formed from a copper alloy or an aluminum alloy. These alloys may have an aluminum coated area which may come into contact with the cooling fluid. No further surface treating is required nevertheless achieving a long-term stable arrangement even in case the casing is in contact with the cooling fluid.

It may generally be provided that the casing components are formed from the same material as thus may enhance the welding conditions.

Generally, the first casing component may serve as a bottom plate and the second casing component may serve as cap, or lid, respectively, for closing the cooling channel.

These advantages may be preferred, for example, for sintered substrates or for substrates on which the power semiconductor devices are sintered on, respectively. In fact, substrates for sintering cannot be wire bonded and tested prior to sintering, since the sintering approach requires a strong pressure on the substrates, which is typically applied mechanically with a rubber stamp, which would destroy the wire bonding.

The welding process does not affect the power modules functionalities and allows creating a reliable connection without using O-ring and screws. This results in compact solution with high reliability and high temperature rating.

It may be provided that feature a1) is realized and that thus a baseplate of the power semiconductor module may be omitted. Accordingly, it is provided that the method comprises steps b1), c1), and d1).

This embodiment allows thus forming the power semiconductor module and thus an arrangement of the power semiconductor module and the cooler without a baseplate. Thus, this embodiment allows an especially easy and cost-saving production process of the power module and correspondingly of the arrangement. Apart from that, weight may be saved which might be an especially important advantage for mobile applications, such as in electrically driven cars.

Alternatively, it may be provided that feature a2) is realized and that a baseplate of the power semiconductor module is provided and thus fixed to the substrate and thus to the second side thereof, i.e., the second substrate side. Accordingly, it is provided that the method comprises steps b2), c2), and d2).

This embodiment allows providing an especially effective and reliable cooling effect as the baseplate may provide a cooling effect additionally to the cooler.

It may further be provided that the cooling structure is welded to the first casing component or the second casing component. According to this embodiment, an especially reliable arrangement may be provided as the cooling structure is not only welded to and thus fixed to the substrate or the baseplate, but it can also be fixed to the first or second casing component, which may result in an improved mechanical stability.

Apart from that, it may be realized that the cooling structure proceeding into the cooling channel has a greater spatial dimension compared to the opening so that an especially effective cooling effect may be realized.

Apart from that, the design and arrangement of the cooling structure may be realized in a very adaptive manner, as it is possible to use different cooling structures each according to the respective requirements independently from the size and geometry of the opening of the first casing component.

The cooling structure may thus be a part initially being separated especially from the first casing component and thus the first casing component may comprise an opening for receiving the cooling area and for receiving the cooling structure.

Alternatively, it may be provided that the cooling structure is designed in a one-part form with the first casing component or the second casing component and is thus part of the first casing component or the second casing component. This embodiment allows an especially simple formation process as the step of connecting the cooling structure may be performed in one step together with connecting the first or second casing component. Therefore, a process step may be omitted which may allow significant advantages. Apart from that, again, it may be realized that the cooling structure proceeding into the cooling channel has a greater spatial dimension compared to the opening so that an especially effective cooling may be realized.

With regard to the opening of the first casing component, it may be provided that the first casing component comprises an opening for receiving the cooling area and for receiving the cooling structure if the cooling structure is designed in a one-part form with the second casing component and that a respective opening in the first casing component is omitted in case the cooling structure is designed in a one-part form with the first casing component.

Given the above, the cooling structure and at least one of the first casing component and the second casing component may form a continuous structural element. This may be realized either by using a one-piece component, or one-part component, respectively, comprising the cooling structure and at least one of the first casing component and the second casing component. Alternatively, a continuous structural element may be formed by a connected, such as welded, two-piece component in which the cooling structure is connected, such as welded, to the first casing component or to the second casing component.

It may further be preferred that the first casing component is connected to the second substrate side or to the second baseplate side by means of welding. This feature allows an especially secure arrangement, as an arrangement having a high mechanical stability may be reached. Apart from that, by welding it may be realized that the temperature influence to the module and thus particularly to the power semiconductor devices is kept below a suitable limit, so that the danger of damaging the power semiconductor devices may be reduced to a minimum or can be fully excluded.

For the same reasons, it may be preferred that the second casing component is connected to the first casing component by means of welding, even though the temperature influence to the power modules may be lower compared to the fixation of the first casing component.

With regard to the welding step, it may be especially preferred that at least one of welding of the cooling structure, of the first casing component or of the second casing component is performed by means of laser welding. Especially by means of laser welding, the temperature influence to the parts to be welded and thus to the power semiconductor module may be significantly reduced. This may be due to the fact that the temperatures arising when using laser welding may be hold in range of well below 250° C. Therefore, damages of parts of the power semiconductor module, such as damages of power semiconductor devices, may be prevented or at least reduced so that a module like described above may be realized in a reliable manner.

It may further be preferred that, in case all of steps a1), b1), c1), and d1) are realized, the first casing component is welded to the connecting area of the second substrate side continuously along a welding path which fully surrounds the opening. According to this embodiment, a very reliable connection may be provided due to the fact that a very stable connection path, such as welding path, is realized. Apart from that, in case the welding path surrounds the whole opening, the substrate is sealed against the first casing component so that no further sealing has to be required. Thus, the provision of O-rings with using screws can be avoided which might lead to an improved reliability and also space saving as no groove is required for the O-Ring and threader holes for the screws.

Correspondingly, in case all of steps a2), b2), c2), and d2) are realized, it may further be preferred that the first casing component is welded to the connecting area of the second baseplate side continuously along a welding path which fully surrounds the opening. According to this embodiment, again, a very reliable connection may be provided due to the fact that a very stable connection path, such as welding path, is realized. Apart from that, in case the welding path surrounds the whole opening, the baseplate is sealed against the first casing component so that no further sealing has to be required. Thus, the provision of O-rings with using screws can be avoided which might lead to an improved reliability and also space saving as no groove is required for the O-Ring and threader holes for the screws.

It may further be preferred that step d1) is performed before step c1) and thus particularly after step b1) or parallel to step b1), or that step d2) is performed before step c2) and thus particularly after step b2) or parallel to step b1). This embodiment allows forming the cooling structure in a very adaptive manner so that the cooling capacity may be tailored to the desired needs. Apart from that, the step of connecting the cooling structure, such as welding the cooling structure, may be performed especially easy.

However, it may also be provided that step d1) is performed parallel to step c1) and thus at the same time as compared to step c1) or that step d2) is performed parallel to step c2) and thus at the same time as compared to step c2). This may be performed for example in order to increase stability of the cooler or to improve the flow of the cooling medium. Further, again, this embodiment allows forming the cooling structure in a very adaptive manner so that the cooling capacity may be tailored to the desired needs. Apart from that, the step of connecting the cooling structure, such as welding the cooling structure, may be performed especially easy.

It may further be preferred that at least one of the first casing component and the second casing component comprises at least one of a fluid inlet and a fluid outlet. This embodiment thus allows in a very efficient and simple manner to use the arrangement of the first casing component and the second casing component as a fluid-based cooler. With this regard, it may be realized that the inlet and the outlet are both provided at the first casing component or at the second casing component, or that one of the inlet and the outlet is provided at the first casing component and the further part of the inlet and the outlet is provided at the further part of the inlet and the outlet. However, due to space reasons, it may be preferred that both of the inlet and the outlet are provided at the second casing component which may also be seen as a kind of cap.

Like can be seen above in detail, the proposed invention allows, in a specific embodiment, the integration of three single half-bridge modules with flat substrate side or flat baseplate into a common metal frame as first casing component by welding technologies and at the same time enhance the heat transfer area on the cooling media side. In a second step a cover as second casing component is welded to it in order to create a fluid tub, for example. The welding process does not affect the power modules functionalities and allows creating a leak tight container without using O-ring and screws. This results in compact solution with high reliability and high temperature rating.

Apart from that, temperature influence may be reduced which in turn reduced the danger of negatively influencing the power semiconductor devices of the module, for example.

To summarize, the following advantages may arise when performing a method as described.

Firstly, the method may allow reduced costs to appear. With this regard, eliminating the pin-fin baseplate or even the entire baseplate and substrate-to-baseplate bond from the bill of materials and manufacturing costs by replacing it with a much cheaper flat baseplate or an insulated metal substrate will enable low-cost concepts, which are particularly attractive for mass-market automotive applications. The cooling structure, such as the turbulator structure, may be provided as a separate part with very low cost or can be manufactured with little extra cost into the cooler frame, i.e., the first casing component. Laser welding of the cooling structure may be realized with very little extra cost in this concept, because it may be performed in one step with the laser welding of the cooler frame and will only prolong the process by a few seconds per module.

Further, improved manufacturability may arise. This may be due to the fact that a flat module bottom side, e.g., during the half-bridge assembly process simplifies manufacturing by easier testing, such as scanning acoustic microscopy, and simplified handling of parts.

Apart from that, increased flexibility may be provided as having the cooler structure separate from, e.g., the half-bridge module allows implementation of changes of the cooler structure, for example if the layout of the chip positions is changed, without the need of costly changes in the assembly line of the half-bridge modules such as by adapting fixture or carrier geometries.

With regard to further advantages and technical features of the method, it is referred to the arrangement, the figures and the further description.

Further described is an arrangement of a power semiconductor module and a cooler, wherein the power semiconductor module comprises a substrate having a first substrate side which carries at least one electric circuit and having a second substrate side being located opposite to the first substrate side, wherein the power semiconductor module contains one out of features a10) and a20).

According to feature a10), the second substrate side has a flat surface and located at the second substrate side is a cooling area which is surrounded by a connecting area, wherein the second substrate side is in contact with the cooler such, that a first casing component of the cooler is connected to the second substrate side at the connecting area, wherein the first casing component optionally comprises at least one opening for receiving the cooling area, and wherein a second casing component is connected to the first casing component such, that a cooling channel for cooling fluid is provided between the first casing component and the second casing component, and wherein a cooling structure is welded to the cooling area at the second substrate side, wherein the cooling structure and at least one of the first casing component and the second casing component form a continuous structural element.

According to feature a20), the power semiconductor module comprises a baseplate, wherein the baseplate comprises a first baseplate side and a second baseplate side being located opposite to the first baseplate side, wherein the first baseplate side is connected to the second substrate side and the second baseplate side has a flat surface, and located at the second baseplate side is a cooling area which is surrounded by a connecting area, wherein the second baseplate side is in contact with the cooler such, that a first casing component of the cooler is connected to the second baseplate side at the connecting area, wherein the first casing component optionally comprises at least one opening for receiving the cooling area, and wherein a second casing component is connected to the first casing component such, that a cooling channel for cooling fluid is provided between the first casing component and the second casing component, and wherein a cooling structure is welded to the cooling area at the second baseplate side, wherein the cooling structure and at least one of the first casing component and the second casing component form a continuous structural element.

Such an arrangement may provide significant advantages over solutions of the prior art. Further, the arrangement as described may comprise or form an inverter and/or may be formed according to a method as described before.

The feature according to which the cooling structure and at least one of the first casing component and the second casing component forms a continuous structural element may be realized either by a one-piece component, or one-part component, respectively, comprising the cooling structure and at least one of the first casing component and the second casing component. Alternatively, a continuous structural element may be formed by a connected, such as welded two-piece component in which the cooling structure is connected, such as welded, to the first casing component or to the second casing component. Thus, a continuous structural element may be understood as a common structural part.

The arrangement as described may provide an improved producibility. Apart from that arrangement may work with effective cooling and high reliability.

With this regard, the power semiconductor module comprises a plurality of power semiconductor devices. Such power semiconductor devices may be generally formed as it is known in the art and may comprise, inter alia, transistors, or switches, respectively, such as MOSFETs and/or IGBTs and/or the plurality of power semiconductor devices may comprise diodes in a non-limiting manner. The power semiconductor devices may be respectively interconnected and may thus be in electrical contact, such as in galvanic contact with the respective areas of the lead frame, such as by soldering or sintering the power semiconductor devices thereon.

In order to allow gentle working conditions of the power semiconductor module and particularly of the power semiconductor devices, the power semiconductor module is connected and thermally coupled to a cooler directly via the substrate or by means of an additional baseplate. The cooler thus serves for dissipating heat from the substrate and thus from the power semiconductor devices.

Therefore, a long-term stable and reliable arrangement of the cooler may be provided which allows a secure working behavior. This may be due to the fact that the fluid-based cooler has an effective cooling capacity.

It may further be provided that the power semiconductor module is a transfer-molded module. According to this embodiment, significant advantageous effects may be reached.

With this regard, transfer-molded power semiconductor modules have become an interesting alternative to the traditional gel or resin encapsulation approach due to benefits with respect to costs, as no housing is required, due to cycle reliability as it is possible to provide hard mold and low-CTE encapsulation of the power semiconductor devices and respective connections, due to environmental protection as low moisture absorption and vapor diffusion is reached, and further due to vibration, shock and handling properties as well as warpage reduction. Thus, transfer-molded modules have significant advantages over solutions of the prior art.

It may further be provided that the power semiconductor module is a three-phase module. Again, this embodiment may show the advantages as described especially effectively, as especially with regard to three-phase modules the connection of a substrate to a cooler was an issue according to the prior art.

With regard to three-phase modules, the following may be noted.

In two-level traction inverters driving a three-phase machine, six functional semiconductor switches are needed. When looking at traction inverters for electric vehicles, for example, the state-of-the-art often comprises a six-pack module integrating three individual phases in a common baseplate or cooler. A typical module of this design is based on a 3-phase pin-fin baseplate, a plastic frame glued to the baseplate.

It is preferred to realize a 3-phase mold module based on three individual mold modules and thus one half-bridge module per phase. In consequence, the mold modules need to be attached to the cooler system after being molded.

Nevertheless, according to the prior art, a one-step sintering approach of a transfer-molded six-pack module is economically very risky. The preferable solution is to head for a six-pack configuration made by three different transfer-molded and sintered half bridge modules, i.e., a three-phase module. However, there are significant challenges.

The integration by using O-ring has potential for improvements mainly for reliability reasons such as due to aging of the O-ring and for the usage of screws which need storage and part numbers for the assembly line. Furthermore, this solution requires space for the screws, e.g., as each half bridge module needs four screws.

Further, the method or technology used for the integration must not damage the power modules. In particular, the temperature should not exceed 225° C. in order not to damage the mold compound and mechanical stresses should be avoided.

The fluid enclosure should be robust and leak tight, and at the same time the design should be space saving and cheap and apart from that, the half bridge module for example and its mechanical integration should be a low cost process. For this reason, the elimination of the baseplate or the use of flat baseplate without cooling fins structures is preferred.

These issues are solved in a very effective manner according to the invention.

In case a baseplate is present, it should be provided that the baseplate material is suitable for the chosen welding technology and should also have a surface finishing which does not require coatings, such as nickel, for the galvanic corrosion protection when installed in a cooling circuit. An example of such a material can be a copper/aluminum baseplate with the aluminum part in contact with the cooling media or and AlSiC baseplate, e.g., enriched with aluminum only in the welding area or a copper/aluminum clad baseplate. The same may apply for the respective material of the substrate in case a baseplate is omitted, wherein the metal or alloy may be formed as a bottom metallization on a ceramic substrate main layer.

The first and second casing components should be made by the same type of material, such as different aluminum alloys, while the welding technology used can be different. For instance, laser welding which is pressure less, very fast and does not lead to high welding temperature can do the welding of the power modules to the first casing component, which generally may also be called a frame, and for welding the cooling structure. Instead, friction stir welding, laser welding, cold metal transfer can do the joint of the second casing component to the first casing component since the requirements in terms of maximum temperature and mechanical stresses are less challenging. However, laser welding would be preferred to use one process for all welding steps.

Regarding the choice of substrate or baseplate material and technology, various options are possible, with the commonality that the side opposite to the power semiconductor devices and thus chips, i.e., the second side thereof, is flat and preferably made of aluminum and that there is a layer electrically insulating the metallization layers on the upper side with the semiconductor chips from the cooling medium on the opposite side. The following examples are possible in a non-limiting manner:

ceramic substrate with Cu or Al metallization bonded to or integrated with aluminum/AlSiC or Copper/Aluminum clad baseplate;

ceramic substrate with thick metallization layers (preferably aluminum metallization on the bottom side for laser welding) and no baseplate;

insulated metal substrate with organic insulation layer and thick metal layer (preferably aluminum) on the bottom side and no baseplate.

With regard to further advantages and technical features of the arrangement, it is referred to the method, the figures and the further description.

FIG. 1 shows a power semiconductor module 10 which should be provided with a cooler 12 by using a method according to the invention like shown in greater detail down below.

The power semiconductor module 10 comprises a substrate 14 having a first substrate side which carries at least one electric circuit 18 and having a second substrate side 20 being located opposite to the first substrate side 16 like shown in greater detail down below with regard to FIGS. 5 and 6 as well as 9 and 10.

The second substrate side 20 may in a further embodiment be connected to a baseplate 15, so that the following description with regard to providing a cooler 12 at the substrate 14 is transferable to providing a cooler 12 to a baseplate 15.

The electric circuit 18 of the power semiconductor module 10 comprises power semiconductor devices 22 which may be sintered to the substrate 14 and which are not shown in FIG. 1, as the power semiconductor module 10 is a transfer-molded module. Thus, a mold compound 24 is shown which encapsulates the electric circuit 18. Thus, the power semiconductor module 10 is an overmolded module. However, terminals 26 for externally contacting the electrical circuit 18 are shown to proceed out of the mold compound 24.

Like described above, the substrate 14 comprises a second substrate side 20, which is adapted for being in contact with the cooler 12. Thus, the cooler 12 will be connected to the second substrate side 20. According to figures, particularly a substrate metallization is shown and forms the second substrate side 20.

The second substrate side 20 is equipped with a cooling area 28 which is surrounded by a connecting area 30. The cooling area 28 is adapted for coming in contact with a cooling fluid or a cooling structure 32 and the connecting area 30 is adapted for being fixed to the cooler 12 like described in greater detail below.

It is further shown that the second substrate side 20 and thus also the cooling area 28 has a flat surface and is thus free of any cooling structure 32.

Such a power semiconductor module 10 may, e.g., be a half-bridge module and may be part of a three-phase module as it is often required for vehicles, for example.

Figure 9:
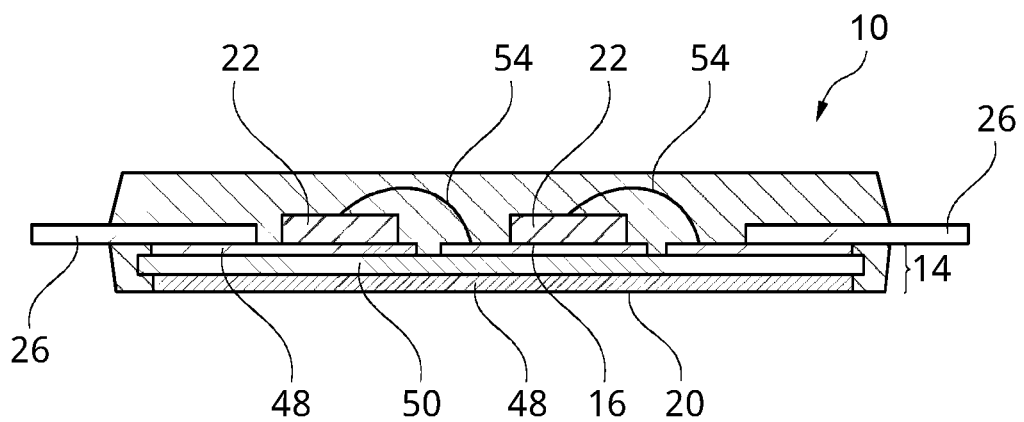
FIG. 9 shows a further embodiment of a power semiconductor module.
Figure 10:
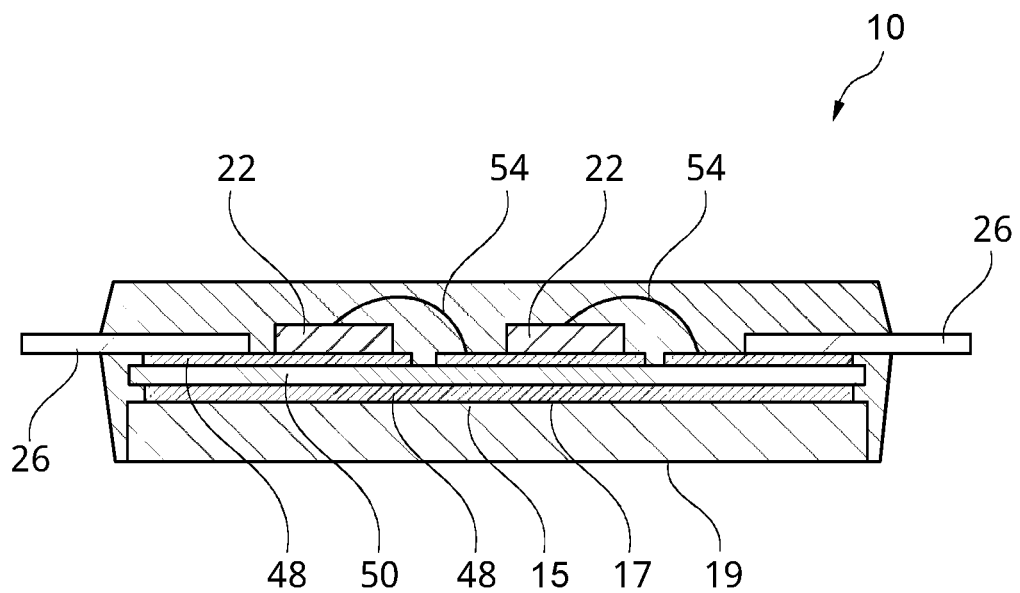
FIG. 10 shows a further embodiment of a power semiconductor module.

Such power semiconductor devices are also shown in FIGS. 9 and 10.

According to FIG. 9, a power semiconductor module 10 is shown which is generally arranged as described above. Therefore, it comprises a substrate 14 which carries metallization 48 on a substrate insulating layer 50, wherein the substrate 14 or a second side 20 thereof is flat in order to come into contact with the cooler 12 and in order to weld a cooling structure 32 thereto. The power semiconductor device 22 of the electric circuit 18 is connected to further areas of the metallization 48 for example by means of a wire bond connection 54. It can further be seen that the electric circuit 18 is encapsulated by the mold compound 24.

The arrangement according to FIG. 10 comprises an additional baseplate 15 having a first baseplate side 17 which is connected to the second substrate side 20 and further having a second baseplate side 19. The second baseplate side 19 is flat in order to come into contact with the cooler 12 and in order to weld a cooling structure 32 thereto.

In order to provide a cooler 12 to the power semiconductor module 10, it is provided to connect a first casing component 34 of the cooler 12 to the second substrate side 20 at the connecting area 30. The first casing component 34 may be formed from aluminum. In order to allow the cooling area 28 and a cooling structure 32 which should be fixed to the second substrate side 20 at a later stage to be active in a working condition of the cooler 12, the first casing component 34 comprises in this embodiment an opening 36 for receiving the cooling area 28 and thus the cooling structure 32 attached later.

Figure 2:
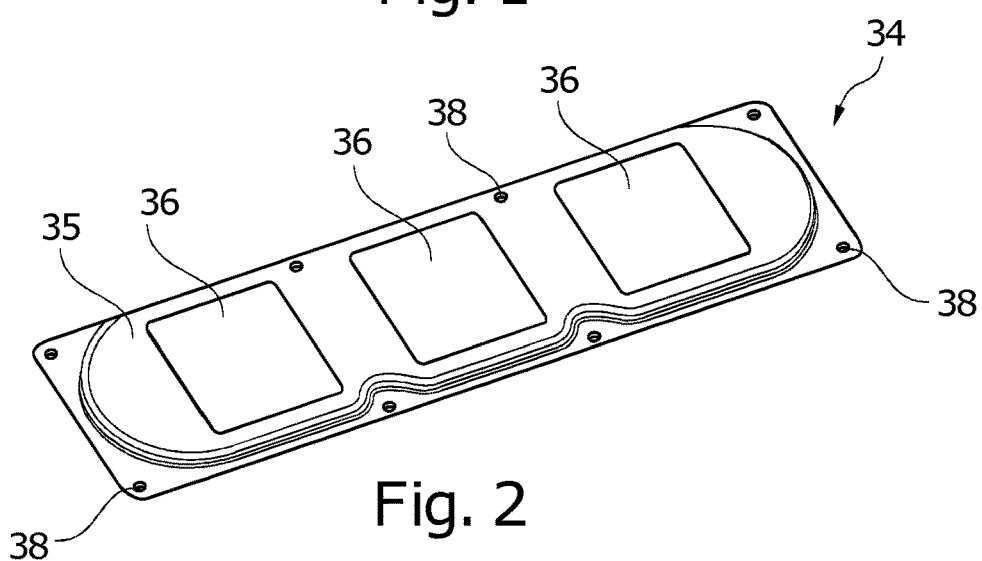
FIG. 2 shows an embodiment of a first casing component.

Such a first casing component 34 is shown in FIG. 2. It is shown that the first casing component 34 comprises three openings 36 which may be adapted for receiving three power semiconductor modules 10, such as three half-bridge modules. Further shown are holes 38 for fixing the arrangement of cooler 12 and power semiconductor module 10 to a support, for example.

Figure 3:
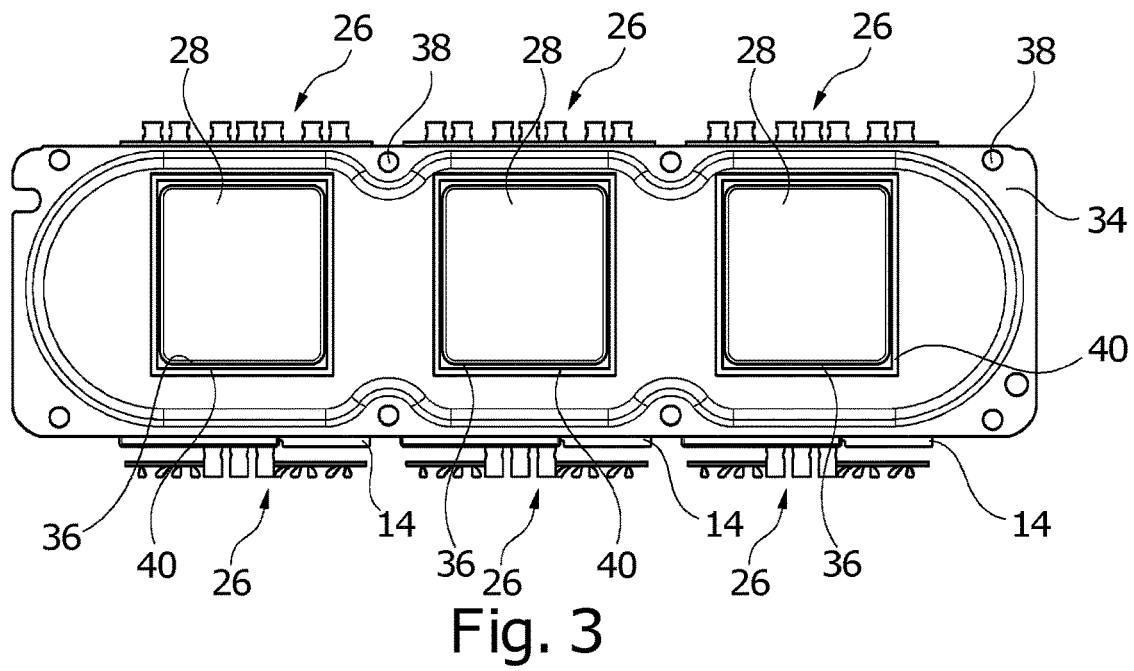
FIG. 3 shows an arrangement of a first casing component fixed to the power semiconductor module after a welding step.

FIG. 3 shows a top view onto the first casing component 34 which is fixed to the power semiconductor module 10, or its substrate 14, respectively, by a welding step. This step may be performed by means of laser welding, for example.

In more detail, it is shown that the first casing component 34 is fixed to the substrate 14 by a continuous welding path 40 which proceeds continuously around the whole opening 36. The welding path 40 thus provides mechanical stability as well as sealing the first casing component 34 against the substrate 14.

Figure 4:
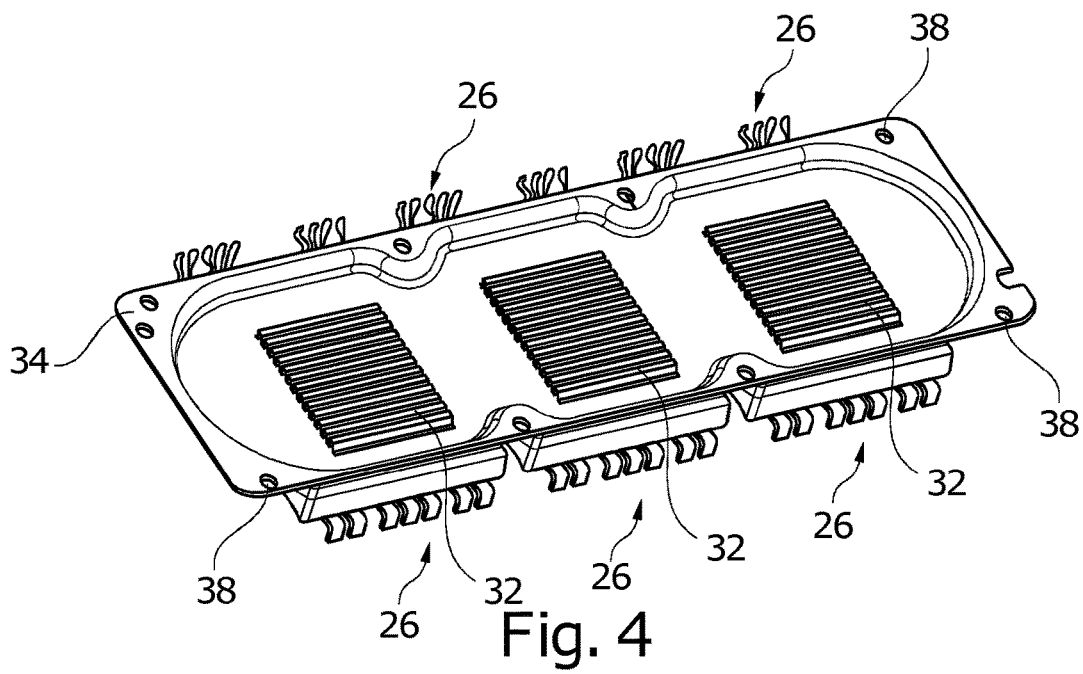
FIG. 4 shows an arrangement of a first casing component fixed to the power semiconductor module after fixing a cooling structure to a substrate of the power semiconductor module.

FIG. 4 shows a further view onto the first casing component 34 being fixed to the power semiconductor module10. According to FIG. 4, it can be seen that a cooling structure 32 is welded to each cooling area 28 of the second substrate side 20 of the substrate 14 in order to increase the heat transfer area. The cooling structure 32 is formed in a waved shape, wherein this arrangement is not meant to limit the present invention.

In FIG. 4 the type of turbulators as cooling structures 32 is the same for all the three half bridge modules but they can also be different in geometry or of different types. For instance, it could be possible to increase the wave crests of the turbulators along the flow direction in order to mitigate the thermal stacking effect and to achieve an improved cooling area or more turbulence. One of the advantages of welding of the cooling structure 32 is for example that different types of cooling structures 32 can be combined providing a high flexibility in the thermal design.

Figure 5:
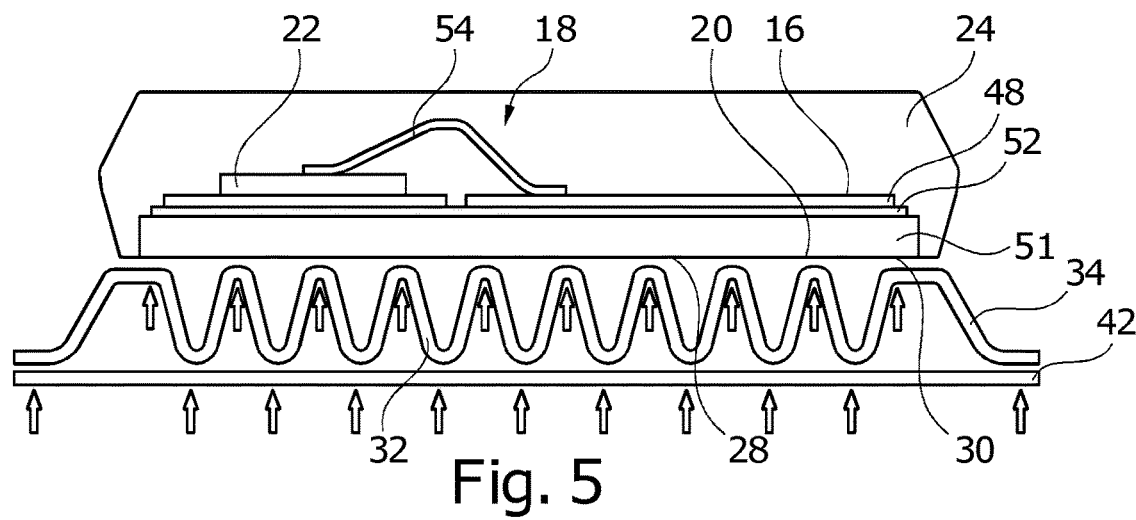
FIG. 5 shows an arrangement of power semiconductor module with first and second casing components which should be fixed to the power semiconductor module and a cooling structure fixed to the baseplate according to a first embodiment.
Figure 6:
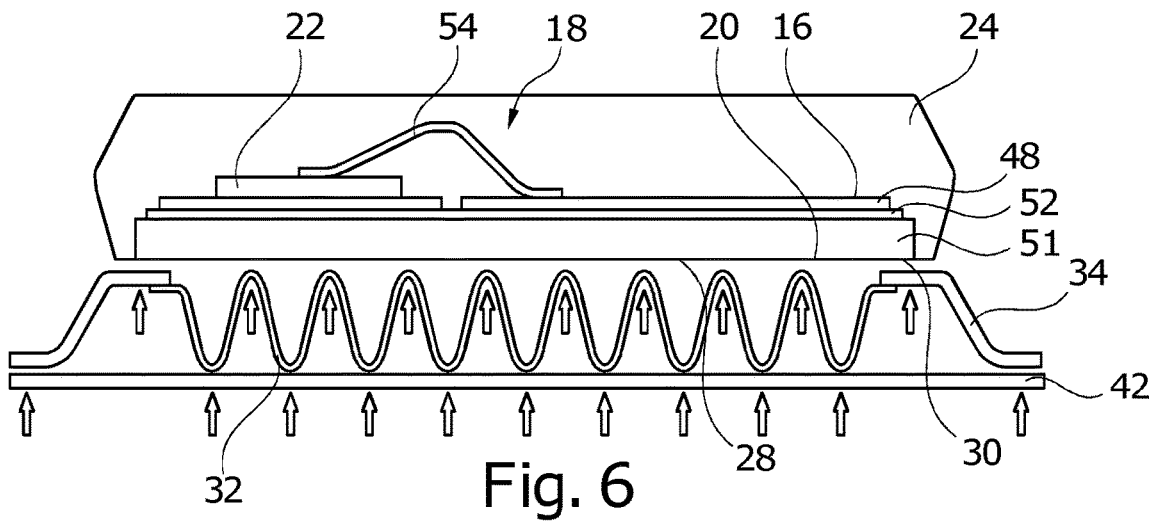
FIG. 6 shows an arrangement of power semiconductor module with first and second casing components which should be fixed to the power semiconductor module and a cooling structure fixed to the baseplate according to a further embodiment.

The provision of the cooling structures 32 is further shown in FIGS. 5 and 6.

In detail, in FIG. 5 it is shown that the power semiconductor module 10 comprises a substrate 14 having a first substrate side 16 which carries at least one electric circuit 18 and having a second substrate side 20 being located opposite to the first substrate side 16. The first substrate side 16 comprises a metallization 48, which is connected to a base metal layer 51 of the substrate 14 by an insulating sheet 52, for example. The power semiconductor device 22 of the electric circuit 18 is connected to further areas of the metallization 48 by means of a wire bond connection 54. It can further be seen that the electric circuit is encapsulated by the mold compound 24.

Regarding the second substrate side 20, it is shown that the first casing component 34 is connected to the substrate 12. In more detail, it can be seen that the first casing component 34 comprises the cooling structure 32 which is formed in a one-part form with the first casing component 34. Further, the second casing component 42 should be connected to the first casing component 34. The arrows should indicate that the first casing component 34, including the cooling structure 32, as well as the second casing component 42 are respectively fixed by means of welding, so that the first casing component 34 is welded to the connecting area 30, the cooling structure 32 is welded to the cooling area 28 and the second casing component 42 is welded to the first casing component 34 and optionally also to the cooling structure 32.

The provision of a one-part form of the cooling structure 32 and the first casing component 34 could be achieved either by manufacturing the cooling structures 32 directly into the first casing component 34 being formed as a cooler frame part, such by any combination of stamping, machining, deformation processes, deep drawing, etc., or by pre-assembling the first casing component 34 and the cooling structure 32 as a separate part and connect them before assembling them to the power semiconductor module 10 by any joining process such as welding, brazing, gluing, etc.

FIG. 6 shows an embodiment which is similar to the embodiment of FIG. 5 so that it is generally referred to the respective description. However, the embodiment according to FIG. 6 is different to that of FIG. 5 due to the fact that the cooling structure 32 is welded to the cooling area 28 but the element forming the cooling structure is also welded to the first casing component 34 and is thus initially a different part compared to the first casing component 34.

Further and with regard to the cooler 12, in order to form the latter, it is further provided that a second casing component 42 is connected to the first casing component 34 and optionally also to the cooling structure 32.

Figure 7:
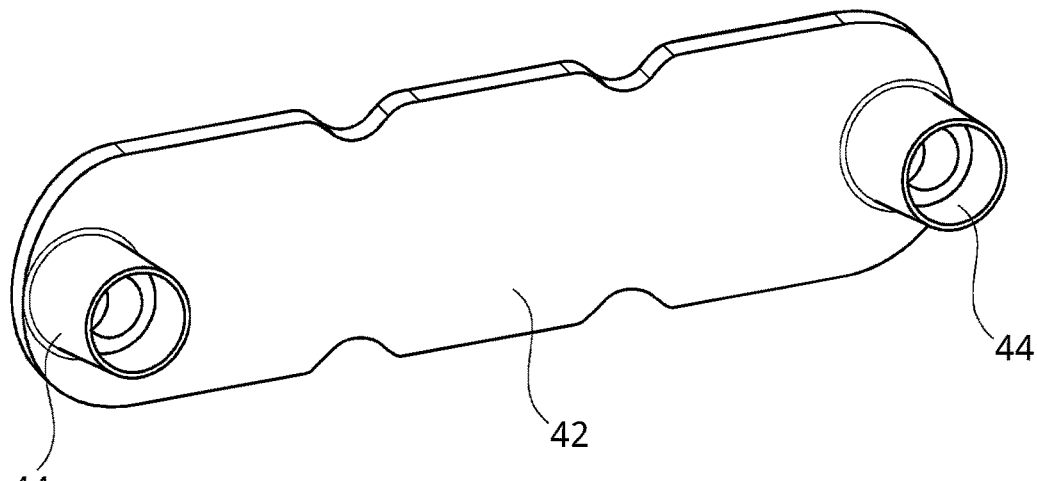
FIG. 7 shows an embodiment of a second casing component.

The second casing component 42 is shown in FIG. 7 in which it is shown, that the second casing component 42 comprises two openings 44, which may serve as inlet and outlet for guiding cooling fluid through the cooler 12.

Figure 8:
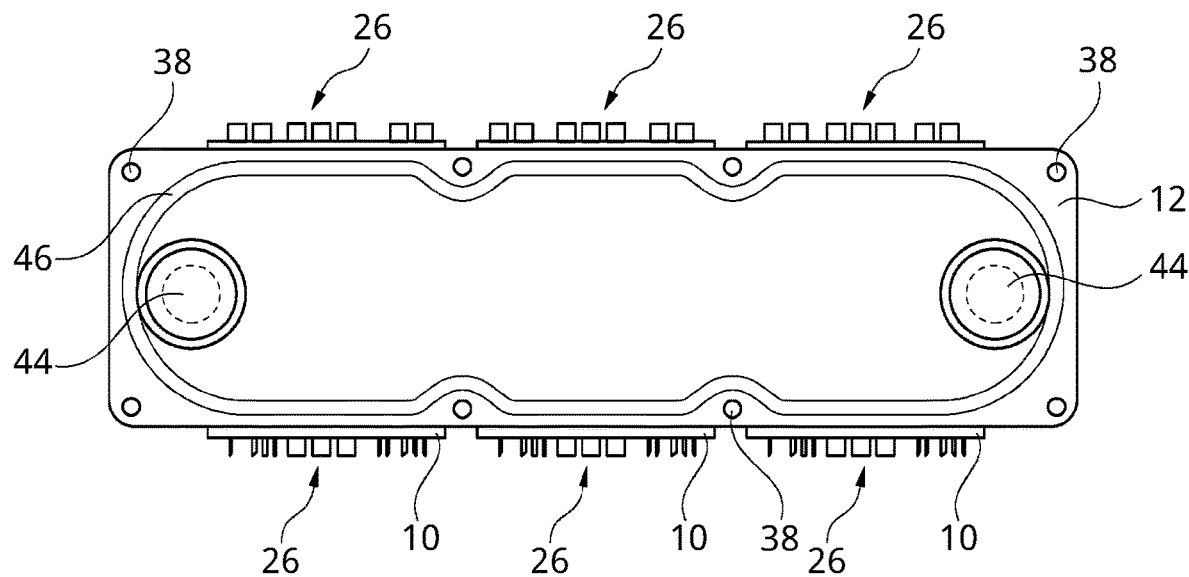
FIG. 8 shows an arrangement of a second casing component fixed to the first casing component after a welding step.

In more detail and like shown in FIG. 8, it is provided that the second casing component 42 is fixed to the first casing component 34 such, that a cooling channel for providing the cooling area 28 or the cooling structure 32 with cooling fluid is provided between the first casing component 34 and the second casing component 42. This is realized in that the second casing component 42 is welded to the first casing component 34 by a welding technique along a welding path 46 which fully surrounds the cooling channel. It may be provided that the welding step is performed by means of friction stir welding, laser welding and cold metal transfer since the requirements in terms of maximum temperature and mechanical stresses are less challenging compared to the welding step of fixing the first casing component 34 and the cooling structure 32 to the substrate 14.

Coming back to the latter welding step of fixing the first casing component 34 to the substrate 14, the material for the substrate, or substrate metallization may be chosen as the best compromise between thermal performance, reliability, corrosion resistance and weldability. The latter point may be of high relevance. In order to avoid brittle intermetallic phases, the material of the substrate 14 at the welding interface and thus at the connecting area 30 the latter may be formed as well from aluminum.

Coming back to the previous figures, it can be seen that the first casing component 34 comprises an elevation 35, which may form the cooling channel in case the first casing component 34 is fixed to the second casing 42 component as shown above. In this case, the first casing component 34 may form a kind of cooling tub, which is closed by the second casing component 42.

Therefore, according to a preferred embodiment without limiting the invention it may thus be provided that a solution to the above-described problem is obtained by combining the integration of the power modules 10 into a common frame as first casing component 34 with the increase of the substrate or baseplate heat transfer area in contact with the cooling media by using welding technologies. The increase of heat transfer area of the power modules 10 with flat plates is of critical importance to cope with the high heat flux densities generated by the dies during switching operations.

In order to cool them efficiently, a higher heat transfer area is required compared to a flat plate as well as high turbulence to increase the fluid heat transfer coefficient. This can be achieved in an efficient and cost competitive way by welding aluminum turbulators or similar cooling structures 32 to the substrate or baseplate side in contact with the cooling media. Aluminum turbulators are cheap and state of the art fins used in the automotive industry for the air conditioning and oil heat exchangers. They can be of different shape and size. The choice is done based on the cooling requirements as the cooling media and turbulence, minimum allowed gap, etc.

The turbulator or similar cooling structure can be inserted as a separate part and welded to the substrate or baseplate, or alternatively, the cooling structure could be an integral part of the cooler frame.

While the invention has been illustrated and described in detail in the drawings and foregoing description, such illustration and description are to be considered illustrative or exemplary and not restrictive; the invention is not limited to the disclosed embodiments. Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

The invention claimed is:

1. A method comprising:
providing a power semiconductor module that comprises a substrate having a first substrate side for carrying at least one electric circuit and having a second substrate side being located opposite to the first substrate side, wherein the second substrate side has a flat surface, and wherein located at the second substrate side is a cooling area that is surrounded by a connecting area;
connecting a first casing component of a cooler to the second substrate side at the connecting area,
connecting a second casing component to the first casing component such that a cooling channel for providing the cooling area with cooling fluid is provided between the first casing component and the second casing component; and
welding a cooling structure to the cooling area at the second substrate side, the cooling structure having a wavy form.

2. The method according to claim 1, wherein the first casing component comprises an opening for receiving the cooling area.

3. The method according to claim 2, wherein the first casing component is welded to the connecting area of the second substrate side along a welding path that fully surrounds the opening.

4. The method according to claim 1, wherein the cooling structure is welded to the first casing component or to the second casing component.

5. The method according to claim 1, wherein the cooling structure is designed in a one-part form with the first casing component or with the second casing component.

6. The method according to claim 1, wherein the first casing component is connected to the second substrate side by welding.

7. The method according to claim 1, wherein the second casing component is connected to the first casing component by welding.

8. The method according to claim 1, wherein the welding comprises laser welding.

9. The method according to claim 1, wherein the welding is performed before connecting the second casing component to the first casing component.

10. The method according to claim 1, wherein the welding is performed at the same time as the second casing component is connected to the first casing component.

11. A method comprising:
providing a power semiconductor module comprising a substrate having a first substrate side for carrying at least one electric circuit and having a second substrate side being located opposite to the first substrate side, wherein the power semiconductor module comprises a baseplate, wherein the baseplate comprises a first baseplate side and a second baseplate side being located opposite to the first baseplate side, wherein the second substrate side is connected to the first baseplate side, wherein the second baseplate side has a flat surface, and wherein located at the second baseplate side is a cooling area which is surrounded by a connecting area;
connecting a first casing component of a cooler to the second baseplate side at the connecting area;
connecting a second casing component to the first casing component such that a cooling channel for providing the cooling area with cooling fluid is provided between the first casing component and the second casing component; and
welding a cooling structure to the cooling area at the second baseplate side, the cooling structure having a wavy form.

12. The method according to claim 11, wherein the first casing component comprises an opening for receiving the cooling area.

13. The method according to claim 12, wherein the first casing component is welded to the connecting area of the second baseplate side along a welding path that fully surrounds the opening.

14. The method according to claim 11, wherein the cooling structure is welded to the first casing component or to the second casing component.

15. The method according to claim 11, wherein the cooling structure is designed in a one-part form with the first casing component or with the second casing component.

16. The method according to claim 11, wherein the first casing component is connected to the second baseplate side welding.

17. The method according to claim 11, wherein the second casing component is connected to the first casing component by welding.

18. The method according to claim 11, wherein the welding comprises laser welding.

19. The method according to claim 11, wherein the welding is performed before connecting the second casing component to the first casing component.

20. The method according to claim 11, wherein the welding is performed at the same time as the second casing component is connected to the first casing component.

21. A device comprising:
- a power semiconductor module comprising a substrate having a first substrate side that carries an electric circuit and having a second substrate side being located opposite to the first substrate side; and
- a cooler;
- wherein either the second substrate side has a flat surface and a cooling area that is surrounded by a connecting area is located at the second substrate side, wherein the second substrate side is in contact with the cooler such that a first casing component of the cooler is connected to the second substrate side at the connecting area, wherein the first casing component comprises an opening for receiving the cooling area, wherein a second casing component is connected to the first casing component such that a cooling channel for cooling fluid is provided between the first casing component and the second casing component, wherein a cooling structure having a wavy form is welded to the cooling area at the second substrate side of the substrate, and wherein the cooling structure and the first casing component or the second casing component form a continuous structural element;
- or the power semiconductor module comprises a baseplate, wherein the baseplate comprises a first baseplate side and a second baseplate side being located opposite to the first baseplate side, wherein the first baseplate side is connected to the second substrate side and the second baseplate side has a flat surface, and located at the second baseplate side is a cooling area which is surrounded by a connecting area, wherein the second baseplate side is in contact with the cooler such, that a first casing component of the cooler is connected to the second baseplate side of the baseplate at the connecting area, wherein the first casing component comprises at least one opening for receiving the cooling area, wherein a second casing component is connected to the first casing component such, that a cooling channel for cooling fluid is provided between the first casing component and the second casing component, wherein a cooling structure having a wavy form is welded to the cooling area at the second baseplate side, and wherein the cooling structure and at least one of the first casing component and the second casing component form a continuous structural element.

22. The device according to claim 21, wherein the power semiconductor module is a transfer-molded module.

23. The device according to claim 21, wherein the power semiconductor module is a three phase module.

* * * * *